(12) United States Patent
Tsurui

(10) Patent No.: US 12,120,827 B2
(45) Date of Patent: Oct. 15, 2024

(54) METHOD FOR MANUFACTURING PRINTED WIRING BOARD AND RESIN SHEET WITH INORGANIC LAYER

(71) Applicant: AJINOMOTO CO., INC., Tokyo (JP)

(72) Inventor: Kazuhiko Tsurui, Kawasaki (JP)

(73) Assignee: AJINOMOTO CO., INC., Tokyo (JP)

( * ) Notice: Subject to any disclaimer, the term of this patent is extended or adjusted under 35 U.S.C. 154(b) by 333 days.

(21) Appl. No.: 16/924,796

(22) Filed: Jul. 9, 2020

(65) Prior Publication Data

US 2021/0014974 A1    Jan. 14, 2021

(30) Foreign Application Priority Data

Jul. 12, 2019 (JP) ................. 2019-130454

(51) Int. Cl.
*H05K 3/00* (2006.01)
*C23C 14/20* (2006.01)
*C23C 14/34* (2006.01)

(52) U.S. Cl.
CPC ........... *H05K 3/0044* (2013.01); *C23C 14/20* (2013.01); *C23C 14/34* (2013.01); *H05K 2203/0221* (2013.01); *H05K 2203/0264* (2013.01); *H05K 2203/107* (2013.01); *H05K 2203/125* (2013.01)

(58) Field of Classification Search
CPC .. H05K 3/0044; H05K 3/0032; H05K 3/4673; H05K 3/00; H05K 3/46; H05K 3/4644; H05K 3/4655; H05K 3/465; H05K 2203/0221; H05K 2203/0264; H05K 2203/107; H05K 2203/125; H05K 2203/016; H05K 2203/06; H05K 1/0298; H05K 2201/0195; C23C 14/20; Y10T 29/49155; Y10T 29/49165

USPC .................. 29/830–831, 846, 852
See application file for complete search history.

(56) References Cited

U.S. PATENT DOCUMENTS

| | | | | |
|---|---|---|---|---|
| 6,739,040 B1* | 5/2004 | Nakamura | ........... | H05K 3/4069 29/830 |
| 8,584,352 B2* | 11/2013 | Narahashi | ............ | H05K 3/4661 29/830 |
| 9,516,765 B2* | 12/2016 | Nakamura | ............. | H05K 3/465 |
| 11,432,400 B2* | 8/2022 | Matsuura | ............. | H05K 3/4644 |

FOREIGN PATENT DOCUMENTS

JP    2008-037957 A    2/2008

\* cited by examiner

*Primary Examiner* — Donghai D Nguyen
(74) *Attorney, Agent, or Firm* — Oblon, McClelland, Maier & Neustadt, L.L.P.

(57) ABSTRACT

Provided is a technique that can achieve an insulating layer with small surface undulations and can suppress a haloing phenomenon in manufacturing a printed wiring board even when using a thin resin composition layer. Specifically, provided is a method for manufacturing a printed wiring board that includes the steps of: (A) preparing a resin sheet with an inorganic layer including (i) a support with an inorganic layer including an inorganic layer, a support in contact with the inorganic layer, and a release layer and (ii) a resin composition layer in contact with the release layer of the support with an inorganic layer; (B) laminating the resin sheet with an inorganic layer onto an internal layer substrate so that the resin composition layer of the resin sheet with an inorganic layer is in contact with the internal layer substrate; (C) curing the resin composition layer to form an insulating layer; and (D) perforating the insulating layer.

19 Claims, No Drawings

METHOD FOR MANUFACTURING PRINTED WIRING BOARD AND RESIN SHEET WITH INORGANIC LAYER

BACKGROUND OF THE INVENTION

1. Field of the Invention

The present invention relates to a method for manufacturing a printed wiring board and further relates to a resin sheet with an inorganic layer.

2. Description of the Related Art

As for printed wiring boards being widely used for various kinds of electronic devices, it is demanded to have thinner layers and finer wiring of circuits in order to achieve downsizing and high functionality of electronic devices.

As a technique of manufacturing a printed wiring board, there is known a manufacturing method using a build-up process of alternately layering insulating layers and conductive layers. In the manufacturing method using the build-up process, electrical connection between conductive layers can be achieved by forming via holes in the insulating layers. For example, Patent Document 1 discloses a technique of laminating a resin composition layer onto an internal layer circuit substrate with using an adhesive sheet including the resin composition layer, curing the resin composition layer to form an insulating layer, and then forming via holes in the insulating layer.

RELATED ART DOCUMENT

Patent Document

Patent Document 1: JP-A-2008-37957

SUMMARY OF THE INVENTION

Problem to be Solved by the Invention

As electronic devices become downsized, the insulating layer tends to be further thinner. However, when using a thin resin composition layer to form the insulating layer, a surface of the resultant insulating layer tends to have undulations corresponding to surface undulations (caused by the presence or absence of circuit wiring) of the internal layer circuit substrate as a base. Such undulations of the surface of insulating layer bring about faulty adhesion with a pattern-forming dry film that is used for forming a wiring layer on the insulating layer or bring about unevenness in the roughness of the surface of insulating layer after roughening treatment, thus leading to faulty formation of fine wiring.

Further, the inventors of the present invention have found out that in a case where the insulating layer is formed using a thin resin composition layer, a haloing phenomenon may occur when forming via holes in the resultant insulating layer. The haloing phenomenon refers to a phenomenon that an insulating resin around a via hole degrades when forming the via hole, which is normally observed as a discolored part. A degraded part where the haloing phenomenon has occurred is easily eroded with a chemical solution such as a roughening solution and causes interlayer peeling between the insulating layer and the internal layer circuit substrate, leading to degraded conduction reliability.

It is an object of the present invention to provide a technique that can achieve an insulating layer with small surface undulations and suppress a haloing phenomenon in manufacturing a printed wiring board even when using a thin resin composition layer.

Means for Solving Problem

The inventors of the present invention made intensive investigations in order to achieve the foregoing object, and as a result, have found that the object can be achieved by a manufacturing method having the following constitution, resulting in the completion of the present invention.

Specifically, the present invention includes the following embodiments.

[1] A method for manufacturing a printed wiring board, comprising the steps of:
  (A) preparing a resin sheet with an inorganic layer including (i) a support with an inorganic layer including an inorganic layer, a support in contact with the inorganic layer, and a release layer and (ii) a resin composition layer in contact with the release layer of the support with an inorganic layer;
  (B) laminating the resin sheet with an inorganic layer onto an internal layer substrate so that the resin composition layer of the resin sheet with an inorganic layer is in contact with the internal layer substrate;
  (C) curing the resin composition layer to form an insulating layer; and
  (D) perforating the insulating layer.
[2] The method according to [1], wherein in the support with an inorganic layer, the release layer is in contact with the inorganic layer.
[3] The method according to [1], wherein in the support with an inorganic layer, the release layer is in contact with the support.
[4] The method according to any one of [1] to [3], further comprising the step of (E) peeling off the support with an inorganic layer from the insulating layer.
[5] The method according to [4], wherein
  in the step (D), perforating is performed using a $CO_2$ laser, and
  the step (E) is performed after the step (D).
[6] The method according to [4], wherein
  in the step (D), perforating is performed using a UV laser, and
  the step (E) is performed before the step (D).
[7] The method according to any one of [1] to [6], wherein when a thickness of the resin composition layer is defined as t1 ($\mu$m), a thickness t ($\mu$m) of the inorganic layer satisfies a relation of t≥0.5/t1, provided that t≥0.05.
[8] The method according to any one of [1] to [7], wherein the inorganic layer is a layer of one or more inorganic materials selected from the group consisting of metals and metal oxides.
[9] A resin sheet with an inorganic layer comprising:
  (i) a support with an inorganic layer including an inorganic layer, a support in contact with the inorganic layer, and a release layer, and
  (ii) a resin composition layer in contact with the release layer of the support with an inorganic layer.

Effect of Invention

The present invention can provide a technique that can achieve an insulating layer with small surface undulations and suppress a haloing phenomenon in manufacturing a printed wiring board even when using a thin resin composition layer.

DETAILED DESCRIPTION OF THE INVENTION

The present invention will next be described in detail by way of preferable embodiments. It should be noted that the present invention is not limited to the following embodiments or examples and can be performed with any modifications to the extent not departing from the claims of the present invention or equivalents thereof.

Before describing a method for manufacturing a printed wiring board of the present invention in detail, there will be described "a resin sheet with an inorganic layer" of the present invention used in the manufacturing method of the present invention.

[Resin Sheet with Inorganic Layer]

The resin sheet with an inorganic layer of the present invention includes:

(i) a support with an inorganic layer including an inorganic layer, a support in contact with the inorganic layer, and a release layer, and (ii) a resin composition layer in contact with the release layer of the support with an inorganic layer.

By using the resin sheet with an inorganic layer having such specific layer structure, there can be achieved an insulating layer with small surface undulations and can suppress a haloing phenomenon even when using a thin resin composition layer.

Support with Inorganic Layer

The support with an inorganic layer includes an inorganic layer, a support in contact with the inorganic layer, and a release layer.

A layer structure of the support with an inorganic layer is not particularly limited so long as the inorganic layer and the support are in contact with each other and the release layer is capable of being in contact with a resin composition layer described below. In a preferable embodiment, the release layer is in contact with the inorganic layer. That is, the support with an inorganic layer has a layer structure of the support/the inorganic layer/the release layer. In another preferable embodiment, the release layer is in contact with the support. That is, the support with an inorganic layer has a layer structure of the inorganic layer/the support/the release layer.

Inorganic Layer

The inorganic layer is not particularly limited so long as it is a layer of an inorganic material, and it is preferably a layer of one or more inorganic materials selected from the group consisting of metals and metal oxides in view of suppressing the haloing phenomenon.

The metal which can be used as the material of the inorganic layer is not particularly limited, and examples thereof include typical metals such as copper, titanium, nickel, aluminum, gold, platinum, palladium, silver, cobalt, chromium, zinc, tungsten, iron, tin, and indium; semi-metals such as silicon and germanium; and alloys thereof. The metal oxide which can be used as the material of the inorganic layer is not particularly limited, and examples thereof include oxides of the above metals. The inorganic layer may be a single layer structure or a multilayer structure in which two or more layers formed of different metals or metal oxides are laminated on each other.

In view of achieving the insulating layer with small surface undulations and excellent flatness and effectively suppressing the haloing phenomenon, it is preferable that the inorganic layer has a certain thickness. Specifically, when the thickness of the resin composition layer described below is defined as $t1$ (μm), a thickness $t$ (μm) of the inorganic layer preferably satisfies a relation of $t \geq 0.5/t1$, and more preferably satisfies a relation of $t \geq 0.75/t1$, $t \geq 1/t1$, $t \geq 2/t1$, $t \geq 5/t1$, $t \geq 10/t1$, $t \geq 20/t1$, $t \geq 30/t1$, $t \geq 40/t1$, or $t \geq 50/t1$. However, in view of effectively suppressing the haloing phenomenon, the thickness $t$ (μm) of the inorganic layer preferably satisfies a relation of $t \geq 0.05$ and more preferably satisfies a relation of $t \geq 0.075$, $t \geq 0.1$, $t \geq 0.2$, $t \geq 0.5$, $t \geq 1$, $t \geq 2$, $t \geq 3$, $t \geq 4$, $t \geq 5$, $t \geq 5$, or $t \geq 6$.

Therefore, in a preferable embodiment, when the thickness of the resin composition layer is defined as $t1$ (μm), the thickness $t$ (with) of the inorganic layer satisfies a relation of $t \geq 0.5/t1$, provided that $t \geq 0.05$. Specifically, when $t1$ is 5 μm, $t$ is preferably 0.1 μm or more. When $t1$ is 10 μm or more, $t$ is preferably 0.05 μm or more.

The upper limit of the thickness of the inorganic layer is not particularly limited, and may usually be 50 μm or less, 30 μm or less, 20 μm or less, 10 μm or less, or the like.

A method for forming the inorganic layer is not particularly limited. In view of achieving the insulating layer with excellent flatness and effectively suppressing the haloing phenomenon, the inorganic layer is preferably an inorganic layer formed by vapor deposition. The inorganic layer formed by vapor deposition more easily results in the insulating layer especially excellent in flatness than an inorganic layer with the same thickness formed by rolling process. In particular, when the inorganic layer formed by vapor deposition is a metal layer, it is advantageous since it can achieve the insulating layer especially excellent in flatness when it has a purity lower than 5N purity (99.999% by mass), preferably 99.99% by mass or less, 99.9% by mass or less, or 99% by mass or less. Examples of vapor deposition include physical vapor deposition (PVD) such as evaporation, sputtering, ion plating and laser abrasion, and chemical vapor deposition (CVD) such as thermal CVD and plasma CVD, and among them, evaporation and sputtering are preferable.

Support

As the support, there may be used known supports which can be used as a support for a resin sheet (an adhesive sheet) in manufacturing a printed wiring board by a build-up process. Among them, a film formed of a plastic material is preferable.

When the film formed of a plastic material is used as the support, examples of the plastic material include polyesters such as polyethylene terephthalate (PET) and polyethylene naphthalate (PEN), polycarbonate (PC), acrylic materials such as polymethyl methacrylate (PMMA), cyclic polyolefins, triacetylcellulose (TAC), polyether sulfide (PES), polyether ketone, and polyimide. Among them, polyethylene terephthalate and polyethylene naphthalate are preferable, and polyethylene terephthalate is particularly preferable since it is inexpensive.

A surface of the support may be subjected to a mat treatment, a corona treatment, or an antistatic treatment.

The thickness of the support is not particularly limited, and is preferably in a range of 5 μm to 75 μm and more preferably in a range of 10 μm to 60 μm.

Release Layer

The release layer may be any layer that enables the support with an inorganic layer to be peeled from the insulating layer after the resin composition layer described below is thermally cured to form the insulating layer.

In a preferable embodiment, the release layer contains one or more release agents selected from the group consisting of an alkyd resin, a polyolefin resin, a urethane resin, a silicone resin, and a melamine resin. The release agent may be used alone or in combination of two or more kinds thereof.

The thickness of the release layer is not particularly limited, and is preferably in a range of 0.01 μm to 5 μm and more preferably in a range of 0.05 μm to 2 μm.

A method for manufacturing the support with an inorganic layer is not particularly limited so long as the above layer structure can be achieved. The support with an inorganic layer having the layer structure of the inorganic layer/the support/the release layer can be manufactured, for example, by applying the release agent to one surface of the support to provide the release layer and providing the inorganic layer on the other surface of the support by vapor deposition. For the part of the support/the release layer, a commercially available support with a release layer may be used. The support with an inorganic layer having the layer structure of the support/the inorganic layer/the release layer can be manufactured, for example, by providing the inorganic layer on one surface of the support by vapor deposition and further applying the release agent to an exposed face of the inorganic layer to provide the release layer.

Resin Composition Layer

The resin sheet with an inorganic layer of the present invention includes the support with an inorganic layer and the resin composition layer in contact with the release layer of the support with an inorganic layer.

A resin composition used for the resin composition layer is not particularly limited so long as its cured product exhibits sufficient mechanical strength and insulating property, and there may be used any known resin compositions used for forming insulating layers of printed wiring boards. Examples of the resin composition include a resin composition containing a curing resin and a curing agent. As the curing resin, known curing resins used for forming an insulating layer of printed wiring board may be used. Among them, an epoxy resin is preferable. Therefore, in an embodiment, the resin composition contains (a) an epoxy resin and (b) a curing agent. The resin composition may further contain additives such as (c) an inorganic filler, (d) a thermoplastic resin, (e) an accelerator, (f) a flame retardant, and (g) an organic filler, if necessary. There will be described about components contained in the resin composition in detail.

(a) Epoxy Resin

Examples of the epoxy resin include a bisphenol type epoxy resin, a dicyclopentadiene type epoxy resin, a trisphenol type epoxy resin, a naphthol novolac type epoxy resin, a phenol novolac type epoxy resin, a tert-butyl-catechol type epoxy resin, a naphthalene type epoxy resin, a naphthol type epoxy resin, an anthracene type epoxy resin, a glycidyl amine type epoxy resin, a glycidyl ester type epoxy resin, a cresol novolac type epoxy resin, a biphenyl type epoxy resin, a linear aliphatic epoxy resin, an epoxy resin having a butadiene structure, an alicyclic epoxy resin, a heterocyclic epoxy resin, a Spiro ring-containing epoxy resin, a cyclohexane type epoxy resin, a cyclohexane dimethanol type epoxy resin, a naphthylene ether type epoxy resin, a trimethylol type epoxy resin, and a tetraphenylethane type epoxy resin. The epoxy resin may be used alone or in combination of two or more kinds thereof. The bisphenol type epoxy resin indicates an epoxy resin having a bisphenol structure, and examples thereof include a bisphenol A type epoxy resin, a bisphenol F type epoxy resin, a bisphenol S type epoxy resin, and a bisphenol AF type epoxy resin. The biphenyl type epoxy resin indicates an epoxy resin having a biphenyl structure where the biphenyl structure may have a substituent such as an alkyl group, an alkoxy group, or an aryl group. Therefore, the biphenyl type epoxy resin also includes a bixylenol type epoxy resin and a biphenyl aralkyl type epoxy resin. The epoxy resin may be used alone or in combination of two or more kinds thereof.

The epoxy resin is preferably an aromatic epoxy resin. The aromatic epoxy resin means an epoxy resin having an aromatic ring in the molecule. The aromatic ring includes not only a monocyclic structure such as a benzene ring but also a polycyclic aromatic structure such as a naphthalene ring and an aromatic heterocyclic structure. The aromatic epoxy resin is preferably one or more selected from the group consisting of a bisphenol type epoxy resin, a biphenyl type epoxy resin, a naphthylene ether type epoxy resin, a naphthalene type tetrafunctional epoxy resin, and a naphthol type epoxy resin.

The epoxy resin preferably has two or more epoxy groups per molecule. The proportion of the epoxy resin having two or more epoxy groups per molecule relative to 100% by mass of a non-volatile component of the epoxy resin is preferably 50% by mass or more, more preferably 60% by mass or more, and further preferably 70% by mass or more.

The epoxy resin includes an epoxy resin that is liquid state at a temperature of 20° C. (hereinafter referred to as "liquid epoxy resin") and an epoxy resin that is solid state at a temperature of 20° C. (hereinafter referred to as "solid epoxy resin"). The resin composition may singly contain the liquid epoxy resin, may singly contain the solid epoxy resin, or may contain the liquid epoxy resin and the solid epoxy resin in combination. In particular, the resin composition preferably contains the solid epoxy resin and preferably singly contains the solid epoxy resin or contains the solid epoxy resin and the liquid epoxy resin in combination.

The solid epoxy resin is preferably a solid epoxy resin having three or more epoxy groups per molecule and more preferably an aromatic solid epoxy resin having three or more epoxy groups per molecule.

The solid epoxy resin is preferably a biphenyl type epoxy resin, a naphthalene type epoxy resin, a naphthalene type tetrafunctional epoxy resin, a cresol novolac type epoxy resin, a dicyclopentadiene type epoxy resin, a trisphenol type epoxy resin, a naphthol type epoxy resin, a biphenyl type epoxy resin, a naphthylene ether type epoxy resin, an anthracene type epoxy resin, a bisphenol type epoxy resin, and a tetraphenylethane type epoxy resin and more preferably a bixylenol type epoxy resin, a biphenyl aralkyl type epoxy resin, a naphthylene ether type epoxy resin, a naphthalene type tetrafunctional epoxy resin, a naphthol type epoxy resin, and a bisphenol type epoxy resin.

Specific examples of the solid epoxy resin include "HP4032H" (a naphthalene type epoxy resin) manufactured by DIC Corporation; "HP-4700" and "HP-4710" (naphthalene type tetrafunctional epoxy resins) manufactured by DIC Corporation; "N-690" (a cresol novolac type epoxy resin) manufactured by DIC Corporation; "N-695" (a cresol novolac type epoxy resin) manufactured by DIC Corporation; "HP-7200" (a dicyclopentadiene type epoxy resin) manufactured by DIC Corporation; "HP-7200HH", "HP-7200H", "EXA-7311", "EXA-7311-G3", "EXA-7311-G4", "EXA-7311-G4S", "HP6000", and "HP6000L" (naphthylene ether type epoxy resins) manufactured by DIC Corporation; "EPPN-502H" (a trisphenol type epoxy resin) manufactured by Nippon Kayaku Co., Ltd.; "NC7000L" (a naphthol novolac type epoxy resin) manufactured by Nippon Kayaku Co., Ltd.; "NC3000H", "NC3000", "NC3000L", and "NC3100" (biphenyl aralkyl type epoxy resins) manufactured by Nippon Kayaku Co., Ltd.; "ESN475V" (a naphthol type epoxy resin) manufactured by Nippon Steel & Sumikin Chemical Co., Ltd.; "ESN485" (a naphthol novolac type epoxy resin) manufactured by Nippon Steel & Sumikin Chemical Co., Ltd.; "YX4000H", "YX4000", and "YL6121" (biphenyl type epoxy resins) manufactured by Mitsubishi Chemical Corporation; "YX4000HK" (a bixylenol type epoxy resin) manufactured by Mitsubishi Chemical Corporation; "YX8800" (an anthracene type epoxy resin) manufactured by Mitsubishi Chemical Corporation; "PG-100" and "CG-500" (bisphenol AF type epoxy resins) manufactured by Osaka Gas Chemicals Co., Ltd.; "YL7760" (a bisphenol AF type epoxy resin) manufactured by Mitsubishi Chemical Corporation; "YL7800" (a fluorene type epoxy resin) manufactured by Mitsubishi Chemical Corporation; "jER1010" (a solid bisphenol A type epoxy resin) manufactured by Mitsubishi Chemical Corporation; and "jER1031S" (a tetraphenylethane type epoxy resin) manufactured by Mitsubishi Chemical Corporation. The solid epoxy resin may be used alone or in combination of two or more kinds thereof.

The liquid epoxy resin is preferably a liquid epoxy resin having two or more epoxy groups per molecule and is more preferably an aromatic liquid epoxy resin having two or more epoxy groups per molecule.

The liquid epoxy resin is preferably a bisphenol type epoxy resin, a naphthalene type epoxy resin, a glycidyl ester type epoxy resin, a glycidyl amine type epoxy resin, a phenol novolac type epoxy resin, an alicyclic epoxy resin having an ester skeleton, a cyclohexane type epoxy resin, a cyclohexane dimethanol type epoxy resin, a glycidyl amine type epoxy resin, and an epoxy resin having a butadiene structure and more preferably a glycidyl amine type epoxy resin, a bisphenol A type epoxy resin, a bisphenol F type epoxy resin, a bisphenol AF type epoxy resin, and a naphthalene type epoxy resin.

Specific examples of the liquid epoxy resin include "HP4032", "HP4032D", and "HP4032SS" (naphthalene type epoxy resins) manufactured by DIC Corporation; "828US", "jER828US", "jER828EL", "825", and "Epicoat 828EL" (bisphenol A type epoxy resins) manufactured by Mitsubishi Chemical Corporation; "jER807" and "1750" (bisphenol F type epoxy resins) manufactured by Mitsubishi Chemical Corporation; "jER152" (a phenol novolac type epoxy resin) manufactured by Mitsubishi Chemical Corporation; "630" and "630LSD" (glycidyl amine type epoxy resins) manufactured by Mitsubishi Chemical Corporation; "ZX1059" (a mixed product of a bisphenol A type epoxy resin and a bisphenol F type epoxy resin) manufactured by Nippon Steel & Sumikin Chemical Co., Ltd.; "EX-721" (a glycidyl ester type epoxy resin) manufactured by Nagase ChemteX Corporation; "Celloxide 2021P" (an alicyclic epoxy resin having an ester skeleton) manufactured by Daicel Corporation; "PB-3600" (an epoxy resin having a butadiene structure) manufactured by Daicel Corporation; and "ZX1658" and "ZX1658GS" (liquid 1,4-glycidyl cyclohexane type epoxy resins) manufactured by Nippon Steel & Sumikin Chemical Co., Ltd. The liquid epoxy resin may be used alone or in combination of two or more kinds thereof.

When the liquid epoxy resin and the solid epoxy resin are used in combination as the epoxy resin, the mass ratio of these resins (the liquid epoxy resin:the solid epoxy resin) is within a range of preferably 1:0.1 to 1:15, more preferably 1:0.5 to 1:10, and particularly preferably 1:1 to 1:8. When the mass ratio of the liquid epoxy resin to the solid epoxy resin falls within such a range, there may be obtained the following effects: i) moderate adhering properties can be obtained when the resin composition is used in a resin sheet form; ii) sufficient flexibility, which results in improvement in handleability, can be obtained when the resin composition is used in a resin sheet form; iii) an insulating layer having sufficient rupture strength can be obtained, and the like.

The epoxy equivalent weight (g/eq.) of the epoxy resin is preferably 50 to 5,000, more preferably 50 to 3,000, even more preferably 80 to 2,000, and particularly preferably 110 to 1,000. When the epoxy equivalent weight of the epoxy resin falls within the above range, the crosslink density of a cured product of the resin composition becomes sufficient, and the insulating layer with small surface roughness can be provided. The epoxy equivalent weight is the mass of a resin containing 1 equivalent of an epoxy group and can be measured in accordance with JIS K7236.

The weight average molecular weight of the epoxy resin is preferably 100 to 5,000, more preferably 250 to 3,000, and further preferably 400 to 1,500. The weight average molecular weight of a resin such as the epoxy resin is a polystyrene-equivalent weight average molecular weight measured by gel permeation chromatography (GPC).

The content of the epoxy resin is preferably 5% by mass or more, more preferably 10% by mass or more, and further preferably 15% by mass or more when an amount of non-volatile components in the resin composition is defined as 100% by mass, in view of obtaining the insulating layer exhibiting favorable mechanical strength and insulating reliability. The upper limit of the content of the epoxy resin is preferably 40% by mass or less, more preferably 35% by mass or less, and particularly preferably 30% by mass or less.

(b) Curing Agent

The curing agent is not particularly limited so long as it has a function of curing the epoxy resin. Examples thereof include a phenol-based curing agent, a naphthol-based curing agent, an active ester-based curing agent, a benzoxazine-based curing agent, a cyanate ester-based curing agent, and a carbodiimide-based curing agent. The curing agent may be used alone or in combination of two or more kinds thereof.

From the viewpoints of heat resistance and water resistance, the phenol-based curing agent and the naphthol-based curing agent are preferably a phenol-based curing agent having a novolac structure and a naphthol-based curing agent having a novolac structure, respectively. From the viewpoint of the adhesive strength (peel strength) with a conductive layer, a nitrogen-containing phenol-based curing agent and a nitrogen-containing naphthol-based curing agent are preferable, and a triazine skeleton-containing phenol-based curing agent and a triazine skeleton-containing naphthol-based curing agent are more preferable. Particularly, a triazine skeleton-containing phenol novolac resin is preferable from the viewpoint of highly satisfying heat resistance, water resistance, and strength of adhesion to a conductive layer. Specific examples of the phenol-based curing agent and the naphthol-based curing agent include "MEH-7700", "MEH-7810", and "MEH-7851" manufactured by Meiwa Plastic Industries, Ltd.; "NHN", "CBN", and "GPH" manufactured by Nippon Kayaku Co., Ltd.; "SN-170", "SN-180", "SN-190", "SN-475", "SN-485", "SN-495", "SN-375", and "SN-395" manufactured by Nippon Steel & Sumikin Chemical Co., Ltd.; and "LA-7052", "LA-7054", "LA-3018", "LA-1356", and "TD2090" manufactured by DIC Corporation.

As the active ester-based curing agent, a resin having one or more active ester groups per molecule can be used. In particular, as the active ester-based curing agent, a compound having two or more highly active ester groups per molecule, such as phenol esters, thiophenol esters, N-hydroxyamine esters, and esters of heterocyclic hydroxy compounds, is preferably used. The active ester-based curing agent is preferably obtained by a condensation reaction of a carboxylic acid compound and/or a thiocarboxylic acid compound with a hydroxy compound and/or a thiol compound. Particularly, from the viewpoint of improving heat resistance, an active ester-based curing agent obtained from a carboxylic acid compound and a hydroxy compound is preferable, and an active ester-based curing agent obtained from a carboxylic acid compound and a phenol compound and/or a naphthol compound is more preferable. Examples of the carboxylic acid compound may include benzoic acid, acetic acid, succinic acid, maleic acid, itaconic acid, phthalic acid, isophthalic acid, terephthalic acid, and pyromellitic acid. Examples of the phenol compound and naphthol compound may include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucine, benzenetriol, a dicyclopentadiene-type diphenol compound, and phenol novolac. The "dicyclopentadiene-type diphenol compound" is a diphenol compound obtained by condensation of one dicyclopentadiene molecule with two phenol molecules.

Preferable specific examples of the active ester-based curing agent include an active ester compound including a dicyclopentadiene-type diphenol structure, an active ester compound including a naphthalene structure, an active ester compound including an acetylated material of phenol novolac, and an active ester compound including a benzoylated material of phenol novolac. Among them, more preferable are an active ester compound including a naphthalene structure and an active ester compound including a dicyclopentadiene-type diphenol structure. The "dicyclopentadiene type diphenol structure" represents a divalent structural unit formed of phenylene-dicyclopentylene-phenylene.

Examples of commercial products of the active ester-based curing agent include "EXB9451", "EXB9460", "EXB9460S", "HPC-8000-65T", "HPC-8000H-65™", and "EXB-8000L-65™" (manufactured by DIC Corporation) as active ester compounds including a dicyclopentadiene type diphenol structure; "EXB9416-70BK", "EXB-8100L-65T", and "EXB-8150-65T" (manufactured by DIC Corporation) as active ester compounds including a naphthalene structure; "DC808" (manufactured by Mitsubishi Chemical Corporation) as an active ester compound including an acetylated material of phenol novolac; "YLH1026" (manufactured by Mitsubishi Chemical Corporation) as an active ester compound including a benzoylated material of phenol novolac; "DC808" (manufactured by Mitsubishi Chemical Corporation) as an active ester compound as an acetylated material of phenol novolac; and "YLH1026" (manufactured by Mitsubishi Chemical Corporation), "YLH1030" (manufactured by Mitsubishi Chemical Corporation), and "YLH1048" (manufactured by Mitsubishi Chemical Corporation) as active ester compounds as benzoylated material of phenol novolac.

Specific examples of the benzoxazine-based curing agent include "JBZ-OD100" (with a benzoxazine ring equivalent weight of 218), "JBZ-OP100D" (with a benzoxazine ring equivalent weight of 218), and "ODA-BOZ" (with a benzoxazine ring equivalent weight of 218) manufactured by JFE Chemical Corporation; "P-d" (with a benzoxazine ring equivalent weight of 217) and "F-a" (with a benzoxazine ring equivalent weight of 217) manufactured by Shikoku Chemicals Corporation; and "HFB2006M" (with a benzoxazine ring equivalent weight of 432) manufactured by Showa Polymers.

Examples of the cyanate ester-based curing agent include a bifunctional cyanate resin such as bisphenol A dicyanate, polyphenol cyanate (oligo(3-methylene-1,5-phenylene cyanate)), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1-1-bis(4-cyanatephenylmethane), bis(4-cyanate-3,5-dimethylphenyl) methane, 1,3-bis(4-cyanatephenyl-1-(methylethylidene)) benzene, bis(4-cyanatephenyl)thioether, and bis(4-cyanatephenyl)ether; a polyfunctional cyanate resin derived from phenol novolac, cresol novolac, and the like; and a prepolymer in which these cyanate resins are partly triazinized. Specific examples of the cyanate ester-based curing agent include "PT30" and "PT60" (phenol novolac type polyfunctional cyanate ester resins), "ULL-950S" (a polyfunctional cyanate ester resin), and "BA230" (a prepolymer in which bisphenol A dicyanate is partly or entirely triazinized to form a trimer) manufactured by Lonza Japan Ltd.

Specific examples of the carbodiimide-based curing agent include Carbodilite (registered trademark) "V-03" (carbodiimide group equivalent weight: 216), "V-05" (carbodiimide group equivalent weight: 216), "V-07" (carbodiimide group equivalent weight: 200), and "V-09" (carbodiimide group equivalent weight: 200) manufactured by Nisshinbo Chemical Inc.; and "Stabaxol (registered trademark) P" (carbodiimide group equivalent weight: 302) manufactured by Rhein Chemie Corporation.

In view of further suppressing the haloing phenomenon, the curing agent preferably contains the active ester-based curing agent. The content of the active ester-based curing agent is preferably 30% by mass or more, and more preferably 50% by mass or more, or 60% by mass or more, when the amount of non-volatile components in the curing agent is defined as 100% by mass.

The quantitative ratio of (a) the epoxy resin to (b) the curing agent, in terms of a ratio of [the total number of epoxy groups in the epoxy resin]:[the total number of reactive groups in the curing agent], is preferably within a range of 1:0.2 to 1:2, more preferably 1:0.3 to 1:1.5, and further preferably 1:0.4 to 1:1.2. The reactive group of the curing agent is an active hydroxyl group, an active ester group, or the like, and differs depending on the kind of the curing agent. The total number of epoxy groups in the epoxy resin is a value obtained by dividing the mass of solid content in each epoxy resin by respective epoxy equivalent weights and summing the calculated values for all epoxy resins. The total number of reactive groups in the curing agent is a value obtained by dividing the mass of solid content in each curing agent by respective reactive group equivalent weights and summing the calculated values for all curing agents. When the quantitative ratio of the epoxy resin to the curing agent falls within such a range, heat resistance of the resultant insulating layer is further improved.

The content of the curing agent is preferably 5% by mass or more, more preferably 10% by mass or more, and further preferably 15% by mass or more when the amount of resin components in the resin composition is defined as 100% by mass. The upper limit of the content of the curing agent is preferably 40% by mass or less, and more preferably 35% by mass or less, or 30% by mass or less. In the present invention, the "resin components" refer to components other than (c) the inorganic filler described below among the non-volatile components constituting the resin composition.

(c) Inorganic Filler

The resin composition preferably further contains the inorganic filler. When containing the inorganic filler, there can be achieved the insulating layer exhibiting further lower coefficient of linear thermal expansion and dielectric tangent.

The material of the inorganic filler is not particularly limited, and examples thereof include silica, alumina, aluminosilicate, glass, cordierite, silicone oxides, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium titanate zirconate, barium zirconate, calcium zirconate, zirconium phosphate, and zirconium phosphate tungstate. Of these, silica is preferable. Examples of silica include amorphous silica, fused silica, crystalline silica, synthesized silica, and hollow silica. Silica is preferably spherical silica. The inorganic filler may be used alone or in combination of two or more kinds thereof.

Examples of commercial products of the inorganic filler include "UFP-30" manufactured by Denka Co., Ltd.; "SP60-05", "SP507-05", and "SPH516-05" manufactured by Nippon Steel Chemical & Material Co., Ltd.; "YC100C", "YA050C", "YA050C-MJE", and "YA010C" manufactured by Admatechs Co., Ltd.; "Silfil NSS-3N", "Silfil NSS-4N", and "Silfil NSS-5N" manufactured by Tokuyama Corporation; and "SC2500SQ", "SO-C4", "SO-C2", and "SO-C1" manufactured by Admatechs Co., Ltd.

The specific surface area of the inorganic filler is preferably 1 $m^2/g$ or more, more preferably 2 $m^2/g$ or more, and particularly preferably 3 $m^2/g$ or more. The upper limit thereof is not particularly limited, and is preferably 60 $m^2/g$ or less, 50 $m^2/g$ or less, or 40 $m^2/g$ or less. The specific surface area can be obtained by adsorbing nitrogen gas onto a sample surface using a specific surface area measurement apparatus ("Macsorb HM-1210" manufactured by Mountech Co. Ltd.) in accordance with the BET method and calculating the specific surface area using the BET multipoint method.

The average particle diameter of the inorganic filler is preferably 4 μm or less, more preferably 3 μm or less, further preferably 2.5 μm or less, further more preferably 2 μm or less, and particularly preferably 1 μm or less, 0.7 μm or less, or 0.5 μm or less. The lower limit of the average particle diameter of the inorganic filler is preferably 0.01 μm or more, more preferably 0.03 μm or more, and further preferably 0.05 μm or more, 0.07 μm or more, or 0.1 μm or more.

The average particle diameter of the inorganic filler can be measured using laser diffraction and scattering method on the basis of the Mie scattering theory. Specifically, the particle size distribution of the inorganic filler is prepared on the volume basis using a laser diffraction and scattering particle size distribution measuring device, and the median diameter thereof can be measured as an average particle diameter. A measurement sample obtained by weighing out 100 mg of the inorganic filler and 10 g of methyl ethyl ketone to a vial container and ultrasonically dispersing it for 10 minutes can be used. For the measurement sample, the particle size distribution of the inorganic filler on the volume basis is measured by a flow cell system using the laser diffraction and scattering particle size distribution measuring device with used light source wavelengths being blue and red. The average particle diameter can be calculated as the median diameter from the obtained particle size distribution. Examples of the laser diffraction and scattering particle size distribution measuring device include "LA-960" manufactured by Horiba, Ltd.

The inorganic filler is preferably treated with a surface treatment agent in view of increasing humidity resistance and dispersibility. Examples of the surface treatment agent include vinylsilane-based coupling agents, (meth)acrylic coupling agents, fluorine-containing silane coupling agents, aminosilane-based coupling agents, epoxysilane-based coupling agents, mercaptosilane-based coupling agents, silane-based coupling agents, alkoxysilanes, organosilazane compounds, and titanate-based coupling agents. The surface treatment agent may be used alone or in combination of two or more kinds thereof. Examples of commercial products of the surface treatment agent include "KBM1003" (vinyltriethoxysilane) manufactured by Shin-Etsu Chemical Co., Ltd., "KBM503" (3-methacryloxypropyltriethoxysilane) manufactured by Shin-Etsu Chemical Co., Ltd., "KBM403" (3-glycidoxypropyltrimethoxysilane) manufactured by Shin-Etsu Chemical Co., Ltd., "KBM803" (3-mercaptopropyltrimethoxysilane) manufactured by Shin-Etsu Chemical Co., Ltd., "KBE903" (3-aminopropyltriethoxysilane) manufactured by Shin-Etsu Chemical Co., Ltd., "KBM573" (N-phenyl-3-aminopropyltrimethoxysilane) manufactured by Shin-Etsu Chemical Co., Ltd., "SZ-31" (hexamethyldisilazane) manufactured by Shin-Etsu Chemical Co., Ltd., "KBM103" (phenyltrimethoxysilane) manufactured by Shin-Etsu Chemical Co., Ltd., "KBM-4803" (a long chain epoxy type silane coupling agent) manufactured by Shin-Etsu Chemical Co., Ltd., and "KBM-7103" (3,3,3-trifluoropropyltrimethoxysilane) manufactured by Shin-Etsu Chemical Co., Ltd.

The degree of surface treatment with the surface treatment agent is preferably confined to a certain range in view of improving the dispersibility of the inorganic filler. Specifically, 100 parts by mass of the inorganic filler is preferably surface-treated with 0.2 part by mass to 5 parts by mass of the surface treatment agent, is preferably surface-treated with 0.2 part by mass to 3 parts by mass thereof, and is preferably surface-treated with 0.3 part by mass to 2 parts by mass thereof.

The degree of surface treatment with the surface treatment agent can be evaluated based on the amount of carbon per unit surface area of the inorganic filler. From the viewpoint of improving dispersibility of the inorganic filler, the amount of carbon per unit surface area of the inorganic filler is preferably 0.02 $mg/m^2$ or more, more preferably 0.1 $mg/m^2$ or more, and still more preferably 0.2 $mg/m^2$ or more. In terms of preventing an increase in the melt viscosity of a resin varnish and the melt viscosity in a sheet form, the amount of carbon per unit surface area of the inorganic filler is preferably 1 $mg/m^2$ or less, more preferably 0.8 $mg/m^2$ or less, and still more preferably 0.5 $mg/m^2$ or less.

The amount of carbon per unit surface area of the inorganic filler can be measured after washing the inorganic filler which has been subjected to the surface treatment with using a solvent (such as methyl ethyl ketone (MEK)). Specifically, a sufficient amount of MEK is added, as the solvent, to the inorganic filler the Surface of which is treated with a surface treatment agent, and the resultant mixture is subjected to ultrasonic washing at 25° C. for 5 minutes. A supernatant liquid is removed and a solid content is dried. Thereafter, the amount of carbon per unit surface area of the inorganic filler can be measured with a carbon analyzer. As the carbon analyzer "EMIA-320V" manufactured by HORIBA Ltd., or the like can be used.

In view of obtaining the insulating layer with a low coefficient of linear thermal expansion and a low dielectric tangent, the content of the inorganic filler in the resin composition is preferably 30% by mass or more, and more preferably 40% by mass or more, or 50% by mass or more when the amount of non-volatile components in the resin composition is defined as 100% by mass. When using the resin composition with a high content of the inorganic filler, surface undulations of the resultant insulating layer tend to be large. However, in the present invention in which the insulating layer is formed using the resin sheet with an inorganic layer, the content of the inorganic filler in the resin composition can further be increased while suppressing the surface undulations of the insulating layer. The content of the inorganic filler in the resin composition may be increased up to 55% by mass or more, 60% by mass or more, 65% by mass or more, or 70% by mass or more, for example.

The upper limit of the content of the inorganic filler in the resin composition is preferably 95% by mass or less, and more preferably 90% by mass or less when the amount of non-volatile components in the resin composition is defined as 100% by mass, in view of obtaining the insulating layer having sufficient mechanical strength.

(d) Thermoplastic Resin

The resin composition may contain the thermoplastic resin. Examples of the thermoplastic resin include a phenoxy resin, a polyvinyl acetal resin, a polyolefin resin, a polyimide resin, a polyamideimide resin, a polyetherimide resin, a polysulfone resin, a polyethersulfone resin, a polyphenylene ether resin, a polyether ether ketone resin, and a polyester resin. The thermoplastic resin may be used alone or in combination of two or more kinds thereof.

The polystyrene-equivalent weight average molecular weight of the thermoplastic resin is preferably 8,000 or more, more preferably 10,000 or more, and further preferably 20,000 or more, or 30,000 or more. The upper limit thereof is preferably 100,000 or less, more preferably 70,000 or less, and further preferably 60,000 or less. The polystyrene-equivalent weight average molecular weight of the thermoplastic resin is measured by gel permeation chromatography (GPC). Specifically, the polystyrene-equivalent weight average molecular weight of the thermoplastic resin is measured using LC-9A/RID-6A manufactured by Shimadzu Corporation as a measurement apparatus, Shodex K-800P/K-804L/K-804L manufactured by Showa Denko K.K. as a column, and chloroform or the like as a mobile phase. The measurement is performed at a column temperature of 40° C., and the polystyrene-equivalent weight average molecular weight can be computed using a standard polystyrene calibration curve.

Examples of the phenoxy resin may include phenoxy resins having at least one skeleton selected from the group consisting of a bisphenol A skeleton, a bisphenol F skeleton, a bisphenol S skeleton, a bisphenol acetophenone skeleton, a novolac skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethylcyclohexane skeleton. The terminal ends of the phenoxy resin may be any of functional groups such as a phenolic hydroxyl group and an epoxy group. The phenoxy resin may be used alone or in combination of two or more kinds thereof. Specific examples of the phenoxy resin include "1256" and "4250" (bisphenol A skeleton-containing phenoxy resins), "YX8100" (a bisphenol S skeleton-containing phenoxy resin), and "YX6954" (a bisphenol acetophenone skeleton-containing phenoxy resin) manufactured by Mitsubishi Chemical Corporation; "FX280" and "FX293" manufactured by Nippon Steel Chemical & Material Co., Ltd.; and "YL7500BH30", "YX6954BH30", "YX7553", "YX7553BH30", "YL7769BH30", "YL6794", "YL7213", "YL7290", and "YL7482" manufactured by Mitsubishi Chemical Corporation.

Examples of the polyvinyl acetal resin include a polyvinyl formal resin and a polyvinyl butyral resin, and a polyvinyl butyral resin is preferable. Specific examples of the polyvinyl acetal resin include "Denka Butyral 4000-2", "Denka Butyral 5000-A", "Denka Butyral 6000-C", and "Denka Butyral 6000-EP" manufactured by Denka Co., Ltd.; and the S-LEC BH series, Bx series (BX-5Z, for example), KS series (KS-1, for example), BL series, and BM series manufactured by Sekisui Chemical Co., Ltd.

Specific examples of the polyimide resin include "RIKACOAT SN20" and "RIKACOAT PN20" manufactured by New Japan Chemical Co., Ltd. Other specific examples of the polyimide resin may include modified polyimides such as a linear polyimide obtained by reaction of bifunctional hydroxyl-terminated polybutadiene, a diisocyanate compound, and a tetrabasic acid anhydride (Japanese Patent Application Laid-Open No. 2006-37083); and polysiloxane skeleton-containing polyimides (Japanese Patent Application Laid-Open Nos. 2002-12667 and 2000-319386).

Specific examples of the polyamideimide resin include "VYLOMAX HR11NN" and "VYLOMAX HR16NN" manufactured by Toyobo Co., Ltd. Specific examples of the polyamideimide resin also include modified polyamideimides such as "KS9100" and "KS9300" (polysiloxane skeleton-containing polyamideimides) manufactured by Hitachi Chemical Co., Ltd.

Specific examples of the polyether sulfone resin include "PES5003P" manufactured by Sumitomo Chemical Co., Ltd. Specific examples of the polyphenylene ether resin include an oligophenylene ether styrene resin "OPE-2St 1200" manufactured by Mitsubishi Gas Chemical Company, Inc. Specific examples of the polyether ether ketone resin include "Sumiploy K" manufactured by Sumitomo Chemical Co. Ltd. Specific examples of the polyether imide resin include "Ultem" manufactured by General Electric Company.

Specific examples of the polysulfone resin include polysulfones "P1700" and "P3500" manufactured by Solvay Advanced Polymers.

Examples of the polyolefin resin include ethylene-based copolymer resins such as low density polyethylenes, ultra-low density polyethylenes, high density polyethylenes, ethylene-vinyl acetate copolymers, ethylene-ethyl acrylate copolymers, and ethylene-methyl acrylate copolymers; polypropylenes; and polyolefin-based elastomers such as ethylene-propylene block copolymers.

Examples of the polyester resin include a polyethylene terephthalate resin, a polyethylene naphthalate resin, a polybutylene terephthalate resin, a polybutylene naphthalate resin, a polytrimethylene terephthalate resin, a polytrimethylene naphthalate resin, and a polycyclohexane dimethyl terephthalate resin.

Among them, the thermoplastic resin is preferably a phenoxy resin and a polyvinyl acetal resin, and a phenoxy resin with a weight average molecular weight of 30,000 or more is particularly preferable.

The content of the thermoplastic resin is preferably 0.1% by mass or more, more preferably 0.3% by mass or more, and further preferably 0.5% by mass or more when the amount of non-volatile components in the resin composition is defined as 100% by mass. The upper limit thereof is preferably 5% by mass or less, more preferably 4% by mass or less, and further preferably 3% by mass or less.

(e) Accelerator

The resin composition may further contain a accelerator. Examples of the accelerator include amine-based accelerators, imidazole-based accelerators, guanidine-based accelerators, metal-based accelerators, and peroxide-based accelerators. Among them, amine-based accelerators, imidazole-based accelerators, and peroxide-based accelerators are preferable. The accelerator may be used alone or in combination of two or more kinds thereof. When using the accelerator, the content of the accelerator in the resin composition is preferably from 0.005% by mass to 1% by mass, and more preferably from 0.01% by mass to 0.5% by mass when the amount of non-volatile components in the resin composition is defined as 100% by mass.

(f) Flame Retardant

The resin composition may further contain a flame retardant. Examples of the flame retardant include organic phosphorous-based flame retardants, organic nitrogen-containing phosphorous compounds, nitrogen compounds, silicone-based flame retardants, and metal hydroxides. The flame retardant may be used alone or in combination of two or more kinds thereof. When using the flame retardant, the content of the flame retardant in the resin composition is not particularly limited, and is preferably from 0.1% by mass to 15% by mass, and more preferably from 0.5% by mass to 10% by mass when the amount of non-volatile components in the resin composition is defined as 100% by mass.

(g) Organic Filler

The resin composition may further contain an organic filler. As the organic filler, there may be used any organic fillers which can be used for forming insulating layers of printed wiring boards. Examples thereof include rubber particles, polyamide fine particles, and silicone particles, and rubber particles are preferable.

The rubber particles is not particularly limited as long as they are fine resin particles prepared by subjecting a resin having rubber elasticity to chemical crosslinking treatment so that they are insoluble and infusible in an organic solvent. Examples of the rubber particles may include: acrylonitrile-butadiene rubber particles, butadiene rubber particles, and acrylic rubber particles. Specific examples of the rubber particles include XER-91 (manufactured by Japan Synthetic Rubber Co., Ltd.), STAPHYLOID AC3355, AC3816, AC3816N, AC3832, AC4030, AC3364, and IM101 (manufactured by Aica Kogyo Co., Ltd.), and PARALOID EXL2655 and EXL2602 (manufactured by Kureha Corporation).

The average particle diameter of the organic filler is preferably within a range of 0.005 μm to 1 μm and more preferably within a range of 0.2 μm to 0.6 μm. The average particle diameter of the organic filler can be measured using a dynamic light scattering method. For example, the measurement can be carried out by uniformly dispersing the organic filler in an appropriate organic solvent by ultrasonic wave or the like, preparing the particle size distribution of the organic filler using a concentrated system particle size analyzer (FPAR-1000, manufactured by Otsuka Electronics Co., Ltd.) on the mass basis, and defining its median diameter as the average particle diameter. When using the organic filler, the content of the organic filler in the resin composition is preferably from 1% by mass to 10% by mass, and more preferably from 2% by mass to 5% by mass when the amount of non-volatile components in the resin composition is defined as 100% by mass.

The resin composition may contain other components, if necessary. Examples of the other components include: an organometallic compound such as an organocopper compound, an organozinc compound and an organocobalt compound; and a resin additive such as a thickener, an anti-foaming agent, a leveling agent, an adhesion-imparting agent, and a colorant.

The resin sheet with an inorganic layer of the present invention can be manufactured, for example, by preparing a resin varnish in which the resin composition is dissolved in an organic solvent, applying the resin varnish to the release layer of the support with an inorganic layer using a die coater or the like, and drying the resin varnish to form the resin composition layer.

Examples of the organic solvent include ketones such as acetone, methyl ethyl ketone (MEK), and cyclohexanone; acetic acid esters such as ethyl acetate, butyl acetate, cellosolve acetate, propylene glycol monomethyl ether acetate, and carbitol acetate; carbitols such as cellosolve and butyl carbitol; aromatic hydrocarbons such as toluene and xylene; and amide-based solvents such as dimethylformamide, dimethylacetamide (DMAc), and N-methylpyrrolidone. The organic solvent may be used alone or in combination of two or more kinds thereof.

The resin varnish may be dried by a known method such as heating and blowing hot air. Although a drying condition is not particularly limited, the resin varnish is dried so that the content of remaining solvent in the resin composition layer is 10% by mass or less, and preferably 5% by mass or less. When, for example, a resin varnish containing 30% by mass to 60% by mass of organic solvent is used, the resin varnish is dried at 50° C. to 150° C. for 3 minutes to 10 minutes, whereby a resin composition layer can be formed. However, these conditions vary depending on the boiling point of the solvent in the resin varnish.

In the resin sheet with an inorganic layer of the present invention, the thickness of the resin composition layer is preferably 40 μm or less, more preferably 30 μm or less, and further preferably 25 μm or less, 20 μm or less, 15 μm or less, or 10 μm or less in view of thinning the layer. The present invention can achieve the insulating layer with small surface undulations and suppress the haloing phenomenon even when using such a thin resin composition layer to form the insulating layer. The lower limit of the thickness of the resin composition layer is not particularly limited, and can usually be 1 μm or more, 5 μm or more, or the like.

The resin sheet with an inorganic layer of the present invention may include other layer. Examples of the other layer include a protective film that is similar to the support provided on an exposed surface of the resin composition layer (that is, the surface opposite to the release layer). The thickness of the protective film is not particularly limited, and can be from 1 μm to 40 μm, for example. By laminating the protective film, there can be inhibited an adhesion of dust or the like to the surface of the resin composition layer and flaws therein.

The resin sheet with an inorganic layer of the present invention can be wound into a roll shape and stored. When the resin sheet with an inorganic layer has the protective film, the resin sheet with an inorganic layer can be used by peeling off the protective film.

[Method for Manufacturing Printed Wiring Board]

The method for manufacturing a printed wiring board of the present invention is characterized in that the method includes the following steps of:

(A) preparing a resin sheet with an inorganic layer including (i) a support with an inorganic layer including an inorganic layer, a support in contact with the inorganic layer, and a release layer and (ii) a resin composition layer in contact with the release layer of the support with an inorganic layer, (B) laminating the resin sheet with an inorganic layer onto an internal layer substrate so that the resin composition layer of the resin sheet with an inorganic layer is in contact with the internal layer substrate, (C) curing the resin composition layer to form an insulating layer, and (D) perforating the insulating layer.

Step (A)

In Step (A), the resin sheet with an inorganic layer including (i) a support with an inorganic layer including an inorganic layer, a support in contact with the inorganic layer, and a release layer and (ii) a resin composition layer in contact with the release layer of the support with an inorganic layer is prepared.

The configuration of the resin sheet with an inorganic layer prepared in Step (A) is as described in the above [Resin Sheet with Inorganic Layer]. In the method for manufacturing a printed wiring board of the present invention, by using the specific resin sheet with an inorganic layer, there can be achieved an insulting layer with small surface undulations and can be suppressed the haloing phenomenon.

As described above, in view of achieving the insulating layer with small surface undulations and excellent flatness and effectively suppressing the haloing phenomenon, it is important for the inorganic layer to have a certain thickness, and it is preferable that when the thickness of the resin composition layer is defined as t1 (µm), the thickness t (µm) of the inorganic layer satisfies a relation of t≥0.5/t1, provided that t≥0.05. Alternatively, when the top diameter of a via hole formed in the insulating layer in Step (D) described below is defined as Lt (µm), if the thickness t (µm) of the inorganic layer satisfies t≥1/Lt, the above effect can be markedly achieved. More preferably, the thickness t (µm) of the inorganic layer satisfies a relation of t≥2/Lt, t 3/Lt, t≥4/Lt, t≥5/Lt, t≥10/Lt, t≥20/Lt, t≥30/Lt, t≥40/Lt, t≥50/Lt, t≥100/Lt, or t≥150/Lt. Also in such a relation expression, in view of effectively suppressing the haloing phenomenon, the thickness t (µm) of the inorganic layer preferably satisfies a relation of t≥0.05, and more preferably satisfies a relation of t≥0.075, t≥0.1, t≥0.2, t≥0.5, t≥1, t≥2, t≥3, t≥4, t≥5, or t≥6.

Therefore, in a preferable embodiment, when the top diameter of the via hole formed in the insulating layer in Step (D) is defined as Lt (µm), the thickness t (µm) of the inorganic layer satisfies a relation of t≥1/Lt, provided that t≥0.05. Specifically, when Lt is 10 µm, t is preferably 0.1 µm or more. When Lt is 20 µm or more, t is preferably 0.05 µm or more. When a plurality of via holes are formed in the insulating layer in Step (D), and if the top diameters of the respective via holes are different from each other, the value of a minimum top diameter may be used for the Lt value.

In a preferable embodiment, Step (A) includes forming the inorganic layer by vapor deposition. In view of particularly markedly achieving the effects of the present invention, when the inorganic layer to be formed by vapor deposition is a metal layer, Step (A) includes forming a metal layer having a purity lower than the 5N purity (99.999% by mass), preferably 99.99% by mass or less, 99.9% by mass or less, or 99% by mass or less. Examples of vapor deposition are as described above.

Step (B)

In Step (B), the resin sheet with an inorganic layer is laminated onto the internal layer substrate so that the resin composition layer of the resin sheet with an inorganic layer is in contact with the internal layer substrate.

The "internal layer substrate" used in Step (B) refers mainly to: a substrate such as a glass epoxy substrate, a metal substrate, a polyester substrate, a polyimide substrate, a BT resin substrate and a thermosetting polyphenylene ether substrate; and a circuit substrate in which a patterned conductive layer (circuit) is formed on one side or both sides of the above substrate. The "internal layer substrate" in the present invention also includes an internal layer circuit substrate that is an intermediate product on which an insulating layer and/or a conductive layer is further to be formed in the production of a printed wiring board. In a case where the printed wiring board is a component-embedded circuit board, an internal layer substrate including a component embedded therein may be used.

The thickness of the circuit wiring patterned on one side or both sides of the substrate is not particularly limited, and is preferably 30 µm or less, and more preferably 20 µm or less, 15 µm or less, or 10 µm or less in view of thinning the layer. The lower limit of the thickness of the circuit wiring is not particularly limited, and is preferably 1 µm or more, and more preferably 2 µm or more, or 3 µm or more.

The Line/Space ratio of the circuit wiring patterned on one side or both sides of the substrate is not particularly limited, and is preferably 200/200 µm or less, more preferably 100/100 µm or less, further preferably 40/40 µm or less, further more preferably 20/20 µm or less, and particularly preferably 10/10 µm or less in order to suppress the surface undulations of the insulating layer. The lower limit of the Line/Space ratio of the circuit wiring is not particularly limited, and is preferably 0.5/0.5 µm or more, and more preferably 1/1 µm or more in order to achieve a favorable resin filling into the spaces.

The lamination of the internal layer substrate and the resin sheet with an inorganic layer can be carried out by, for example, thermal pressing the resin sheet with an inorganic layer to the internal layer substrate in a state that the resin composition layer of the resin sheet with an inorganic layer is in contact with the internal layer substrate. Examples of a member used for thermal pressing the resin sheet with an inorganic layer to the internal layer substrate (hereinafter, referred to as a "thermal pressing member") include a heated metal plate (such as a SUS mirror plate) and a metal roll (a SUS roll). The thermal pressing member may be pressed against the resin sheet with an inorganic layer in a state that an elastic material such as heat resistant rubber intervenes therebetween, instead of directly pressing the thermal pressing member to the resin sheet with an inorganic layer.

The lamination of the internal layer substrate and the resin sheet with an inorganic layer may be carried out by a vacuum lamination method. In the vacuum lamination method, the thermal pressing temperature is preferably in a range of 60° C. to 160° C. and more preferably in a range of 80° C. to 140° C., the thermal pressing pressure is preferably in a range of 0.098 MPa to 1.77 MPa and more preferably in a range of 0.29 MPa to 1.47 MPa, and the thermal pressing time is preferably in a range of 20 seconds to 400 seconds and more preferably in a range of 30 seconds to 300 seconds. It is preferable that the lamination is carried out under a reduced pressure condition of 26.7 hPa or less.

The lamination can be carried out by a commercially available vacuum laminator. Examples of the commercially available vacuum laminator may include a vacuum pressure laminator manufactured by MEIKI CO., LTD. and a vacuum applicator manufactured by Nikko Materials Co., Ltd.

After the lamination, the laminated resin sheet may be subjected to a smoothening treatment, for example, by pressing the thermal pressing member from the exposed surface side of the resin sheet with an inorganic layer. A pressing condition for the smoothing treatment may be the same as the thermal pressing condition for the lamination described above. In the smoothing treatment, a commercially available vacuum laminator may be used. The laminating and the smoothing treatment may be performed continuously using the commercially available vacuum laminator.

Step (C)

In Step (C), the resin composition layer is cured to form the insulating layer.

The condition for curing of the resin composition layer is not particularly limited. The condition may be a condition that is usually employed in formation of an insulating layer of a printed wiring board. The haloing phenomenon tends to occur more markedly when the condition for curing of the resin composition layer is harsher (higher temperature or longer time). However, the manufacturing method of the present invention in which the insulating layer is formed using the resin sheet with an inorganic layer can advantageously suppress the haloing phenomenon regardless of the curing conditions of the resin composition layer.

A condition for curing the resin composition layer varies depending on the type of the resin composition and the like. For example, the curing temperature is preferably from 120° C. to 240° C., more preferably from 150° C. to 220° C., and further preferably from 170° C. to 210° C. The curing time can be preferably from 5 minutes to 120 minutes, more preferably from 10 minutes to 100 minutes, and further preferably from 15 minutes to 100 minutes.

Before curing the resin composition layer, the resin composition layer may be preheated at a temperature lower than the curing temperature. For example, before curing the resin composition layer, the resin composition layer may be preheated at a temperature of 50° C. or more and less than 120° C. (preferably 60° C. or more and 115° C. or less, and more preferably 70° C. or more and 110° C. or less) for 5 minutes or more (preferably for 5 minutes to 150 minutes, and more preferably for 15 minute to 120 minutes, and further preferably for 15 minute to 100 minutes).

The manufacturing method of the present invention in which the insulating layer is formed using the resin sheet with an inorganic layer can form the insulating layer with small surface undulations and exhibiting favorable flatness. The undulations of surface of the insulating layer can be evaluated by a maximum sectional height Rt of the surface of the insulating layer. The manufacturing method of the present invention can reduce the maximum sectional height Rt of the surface of the insulating layer obtained in Step (C) to preferably less than 1.2 μm and markedly contributes to formation of fine wiring.

The maximum sectional height Rt of surface of the insulating layer can be measured using a noncontact-type surface roughness meter. Specific examples of the noncontact-type surface roughness meter include "WYKO NT3300" manufactured by Veeco Instruments Inc.

Step (D)

In Step (D), the insulating layer is perforated. Thus, a via hole is formed in the insulating layer.

Perforating may be performed using, for example, a drill, a laser, plasma, sand blasting, or the like in accordance with the composition of the resin composition used for forming the insulating layer or the like, or performed by combining these methods with each other, if necessary. Of these, in view of further achieving the effects of the present invention, perforating with a laser such as a $CO_2$ laser, a UV laser, or an excimer laser is preferable.

Perforating conditions by a laser (laser wavelength, pulse number, pulse width, and output power, for example) are not particularly limited so long as via holes having a favorable via shape and having an expected diameter with a small internal smear amount can be formed and may be determined as appropriate within the range of general processing conditions in accordance with the specifications of a used laser processing machine.

The shape of the via hole is not particularly limited, and is generally a circular shape (a substantially circular shape). The top diameter Lt (μm) of the via hole may be determined as appropriate in accordance with the design of the printed wiring board, and can usually be 100 μm or less, and is preferably 80 μm or less, 70 μm or less, 60 μm or less, or 50 μm or less. When forming the via hole with a small diameter, the top diameter Lt (μm) of the via hole may be 40 μm or less, 30 μm or less, 20 μm or less, or 15 μm or less, for example. The lower limit of the top diameter Lt (μm) is not particularly limited, and can usually be 3 μm or more, and 5 μm or more, or the like.

When perforating the insulating layer, a degradation of resin in the insulating layer may occur around the via hole due to generated heat. A degraded part where the haloing phenomenon occurs is usually observed as a discolored part. The degraded part is easily eroded with a chemical solution such as a roughening solution and causes interlayer peeling between the insulating layer and the internal layer substrate, leading to degraded conduction reliability. In contrast, the manufacturing method of the present invention using the resin sheet with an inorganic layer can advantageously suppress the haloing phenomenon even in an environment where heat is likely to be generated such as perforating with a laser.

The extent of the haloing phenomenon can be evaluated by the width of the discolored part (a haloing part) from an edge of the via top of the via hole obtained in Step (D). Specifically, a difference r2−r1 between a radius r1 of via top of the via hole (μm: corresponding to an inner circumferential radius of the haloing part) and an outer circumferential radius r2 (μm) of the haloing part corresponds to the width of the haloing part from the edge of the via top (a haloing distance Wt). The outer circumferential radius r2 (μm) of the haloing part is an outer circumferential radius of the haloing part measured when the surface of the insulating layer is observed from above in a direction perpendicular to a principal face of the insulating layer. The haloing distance Wt (μm) from the edge of the via top tends to increase as the top diameter of the formed via hole increases. The manufacturing method of the present invention can reduce the haloing distance Wt (μm) to preferably 10 μm or less, 8 μm or less, or the like even when forming a relatively large via hole with a top diameter of 60 μm or more. When forming a relatively small via hole with a top diameter of about 30 μm, the haloing distance Wt (μm) can be reduced to a value as small as 5 μm or less.

The manufacturing method of the present invention can reduce a haloing ratio Ht (%) calculated by the expression below to a value as extremely small as preferably 35% or less. In the expression below, the meanings of Wt and Lt are as described above.

$$Ht\ (\%) = Wt/(Lt/2) \times 100$$

Step (E)

The method for manufacturing a printed wiring board of the present invention further includes a step of (E) peeling off the support with an inorganic layer from the insulating layer. Thus, the surface of the insulating layer is exposed, and a conductive layer can be formed on the exposed surface.

Step (E) may be performed before Step (D) (that is, between Step (C) and Step (D)) or may be performed after Step (D). The manufacturing method of the present invention using the resin sheet with an inorganic layer advantageously suppresses the haloing phenomenon regardless of timing at which Step (E) is performed. It is therefore inferred that a difference in an environmental history that the insulating layer and the like receive until Step (C) (relative to a conventional technique) contributes to suppression of the haloing phenomenon.

In Step (D), concerning a preferable embodiment of perforating the insulating layer with a laser, when using the UV laser which is generally large in laser output power, Step (E) is preferably performed before Step (D) in view of suppressing adhesion of residues originating from the support to the insulating layer. Therefore, in a preferable embodiment, perforating is performed using the UV laser in Step (D), and Step (E) is performed before Step (D). When using the $CO_2$ laser which is generally relatively small in laser output power, Step (E) may be performed after Step (D). Therefore, in a preferable embodiment, perforating is performed using the $CO_2$ laser in Step (D), and Step (E) is performed after Step (D).

In manufacturing the printed wiring board, a step of (F) roughening the insulating layer and a step of (G) forming a conductive layer on a surface of the insulating layer may be further performed. These steps (F) and (G) may be performed by any methods that are known to those skilled in the art in the manufacture of a printed wiring board. When Step (E) is performed after Step (D), Step (E) may be performed between Step (D) and Step (F) or between Step (F) and Step (G).

Step (F) is a step of roughening the insulating layer (also referred to as desmear treatment). The procedure and condition for roughening are not particularly limited, and publicly known procedure and condition that are generally used in formation of an insulating layer of a printed wiring board may be used. The insulating layer may be roughened by a swelling treatment with a swelling solution, a roughening treatment with an oxidant, and a neutralization treatment with a neutralization solution in this order, for example. The swelling solution is not particularly limited, and examples thereof may include an alkaline solution and a surfactant solution. An alkaline solution is preferable. As the alkaline solution, a sodium hydroxide solution and a potassium hydroxide solution are preferable. Examples of a commercially available swelling solution may include "Swelling Dip Securiganth P" and "Swelling Dip Securiganth SBU" available from Atotech Japan K. K. The swelling treatment with the swelling solution is not particularly limited, and for example, can be performed by immersing the insulating layer into the swelling solution at 30° C. to 90° C. for 1 minute to 20 minutes. From the viewpoint of controlling the swelling of resin in the insulating layer to an appropriate level, it is preferable to immerse the insulating layer into the swelling liquid at 40° C. to 80° C. for 5 minutes to 15 minutes. The oxidant is not particularly limited, and examples thereof may include an alkaline permanganate solution in which potassium permanganate or sodium permanganate is dissolved in an aqueous solution of sodium hydroxide. The roughening treatment with the oxidant such as the alkaline permanganate solution is preferably performed by immersing the insulating layer into an oxidant solution that is heated at 60° C. to 80° C. for 10 minutes to 30 minutes. The concentration of permanganate in the alkaline permanganate solution is preferably 5% by mass to 10% by mass. Examples of a commercially available oxidant may include an alkaline permanganate solution such as "Concentrate Compact CP" and "Dosing Solution Securiganth P" available from Atotech Japan K.K. It is preferable that the neutralization solution be an acidic aqueous solution. Examples of a commercially available product may include "Reduction Solution Securiganth P" available from Atotech Japan K.K. The treatment with the neutralization solution may be performed by immersing the insulating layer a surface of which has been roughened with the oxidant solution into the neutralization solution at 30° C. to 80° C. for 5 minutes to 30 minutes. From the viewpoint of workability and the like, a method of immersing the object that has been subjected to the roughening treatment with the oxidizing agent into the neutralizing liquid at 40° C. to 70° C. for 5 minutes to 20 minutes is preferable.

Step (G) is a step of forming the conductive layer.

A conductive material used for the conductive layer is not particularly limited. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or an alloy layer. Examples of the alloy layer may include layers formed of an alloy of two or more metals selected from the above-described group such as a nickel-chromium alloy, a copper-nickel alloy, and a copper-titanium alloy. In particular, from the viewpoints of versatility of formation of the conductive layer, cost, and ease of patterning, the conductive layer is preferably a single metal layer of chromium, nickel, titanium, aluminum, zinc, gold, palladium, silver or copper, or an alloy layer of a nickel-chromium alloy, a copper-nickel alloy or a copper-titanium alloy; more preferably a single metal layer of chromium, nickel, titanium, aluminum, zinc, gold, palladium, silver or copper, or an alloy layer of a nickel-chromium alloy; and further preferably a single metal layer of copper.

The conductive layer may have a single-layer structure or a multi-layer structure in which two or more layers of single metal layer or alloy layer formed of different kinds of metals or alloys are layered. When the conductive layer has a multi-layer structure, it is preferable that a layer in contact with the insulating layer be a single metal layer of chromium, zinc or titanium or an alloy layer of nickel-chromium alloy.

The thickness of the conductive layer varies depending on a desired design of a printed wiring board, and is preferably 30 μm or less, and more preferably 20 μm or less, 15 μm or less, or 10 μm or less in view of thinning the layer. The lower limit of the thickness of the circuit wiring is not particularly limited, and is preferably 1 μm or more, and more preferably 2 μm or more, or 3 μm or more.

In an embodiment, the conductive layer may be formed by plating. For example, a conductive layer having a desired wiring pattern (a circuit wiring) can be formed by plating the surface of the insulating layer through a conventionally known technique such as a semi-additive method and a full-additive method. The Line/Space ratio of the circuit wiring is not particularly limited, and may be values described above for the circuit wiring of the internal layer substrate.

Step (A) to Process (G) may be repeatedly performed to form a multilayer wiring structure.

[Semiconductor Device]

A semiconductor device of the present invention includes a printed wiring board. The semiconductor device of the present invention can be manufactured using the printed wiring board obtained by the manufacturing method of the present invention.

Examples of the semiconductor device include various kinds of semiconductor devices used in electrical products (e.g., computers, cellular phones, digital cameras, and TV sets), transportation (e.g., motorcycles, automobiles, electric trains, ships, and aircraft), and the like.

The semiconductor device of the present invention can be manufactured by mounting a component (a semiconductor chip) at a "conductive part" of the printed wiring board. The "conductive part" is a "part transmitting electrical signals in the printed wiring board", which may be on the surface or an embedded part. The semiconductor chip is not particularly limited so long as it is an electrical circuit element made of a semiconductor.

A method for mounting the semiconductor chip when the semiconductor device is manufactured is not particularly limited so long as the semiconductor chip effectively functions. Specific examples thereof include wire bonding mounting, flip-chip mounting, mounting by a bumpless build-up layer (BBUL), mounting by an anisotropic conductive film (ACF), and mounting by a nonconductive film (NCF). Among them, "mounting by a bumpless build-up layer (BBUL)" refers to "mounting that directly embeds a semiconductor chip in a recess of a printed wiring board and connects the semiconductor chip and wiring on the printed wiring board to each other".

EXAMPLES

Hereinafter, the present invention will be described more specifically by Examples. The present invention, however, is not limited to these Examples. In the following description, "part(s)" and "%" in terms of amounts represent "part(s) by mass" and "% by mass", respectively, unless otherwise explicitly specified.

Various measurement methods and evaluation methods will be described first.

[Preparation of Sample for Measurement and Evaluation]

(1) Preparation of Internal Layer Substrate

As an internal layer substrate, a double-sided copper clad layered body with an epoxy resin-glass cloth base material in which a circuit conductor (with a copper remaining rate of 59%) of a grid pattern (a 1 mm square grid) is formed on both sides (the thickness of a copper foil of 3 μm, the thickness of a substrate of 0.15 mm, "HL832NSF LCA" manufactured by Mitsubishi Gas Chemical Company, Inc., with a size of 255×340 mm) was prepared. The internal layer substrate was put into an oven at 130° C. and was dried for 30 minutes.

(2) Lamination of Resin Sheet with Inorganic Layer

A protective film was peeled off from the resin sheet with an inorganic layer produced in Examples and Comparative Examples. The resin sheet with an inorganic layer was laminated on both sides of the internal layer substrate using a batch-type vacuum pressure laminator (two-stage build-up laminator "CVP700" manufactured by Nikko-Materials Co., Ltd.) so that the resin composition layer was in contact with the internal layer substrate. The lamination was performed by reducing the pressure for 30 seconds to an air pressure of 13 hPa or less and then pressing for 45 seconds at 130° C. and a pressure of 0.74 MPa. After the lamination, thermal press was performed for 75 seconds at 120° C. and a pressure of 0.5 MPa. For a substrate that perforating was performed using the UV laser in "(4) Perforation of Insulating Layer" described below, Resin Sheet with Inorganic Layer A (with a resin composition layer thickness of 10 μm) was used, whereas for a substrate that perforating was performed using the $CO_2$ laser, Resin Sheet with Inorganic Layer B (with a resin composition layer thickness of 25 μm) was used.

(3) Thermal Curing of Resin Composition Layer

The internal layer substrate on which the resin sheet with an inorganic layer was laminated was heated for 30 minutes after being put into an oven at 100° C., and then was heated for 30 minutes after being transferred to an oven at 180° C. to thermally cure the resin composition layer, thus forming insulating layers on both sides of the internal layer substrate. The obtained substrate is referred to as "Substrate A for Evaluation".

(4) Perforation of Insulating Layer

The insulating layer was perforated to form via holes. As perforation of the insulating layer, both of the perforation using the $CO_2$ laser and the perforation using the UV laser were performed. Specific condition of perforation is as follows. The obtained substrate is referred to as "Substrate B for Evaluation".

Perforation Using UV Laser:

Using a UV-YAG laser processing machine ("LU-2L212/M50L" manufactured by Via Mechanics, Ltd.), the insulating layer was irradiated with laser light to form a plurality of via holes with a top diameter of about 30 μm. After peeling off the support with an inorganic layer from the insulating layer, the insulating layer was directly irradiated with the laser light. The irradiation conditions of the laser light included a power of 0.08 W and shot number of 25.

Perforation Using $CO_2$ Laser:

Using a $CO_2$ laser processing machine ("605GTWIII(-P)" manufactured by Mitsubishi Electric Corporation), the insulating layer was irradiated with laser light to form a plurality of via holes with a top diameter of about 60 μm. In a state where the support with an inorganic layer laminated on the insulating layer, the insulating layer was irradiated with the laser light through the support with an inorganic layer. The irradiation conditions of the laser light included a mask diameter of 1 mm, a pulse width of 16 μs, an energy of 0.2 mJ/shot, shot number of 2, and a burst mode (10 kHz).

<Measurement of Layer Thickness>

The thickness of layers such as the resin composition layer in the resin sheet with an inorganic layer produced in Examples and Comparative Examples was measured using a contact-type film thickness meter ("MCD-25MJ" manufactured by Mitutoyo Corporation).

<Evaluation of Flatness>

The support with an inorganic layer was peeled off from Substrate A for Evaluation. For the exposed insulating layer, the flatness of the insulating layer in an area on the grid-patterned circuit conductor was measured with a noncontact-type surface roughness meter ("WYKO NT3300" manufactured by Veeco Instruments Inc.). With a magnification of 10×, the maximum sectional height Rt was measured for four areas of 0.82 mm×1.1 mm, and an average was calculated. A case in which the average of Rt was less than 1.2 μm was evaluated to be "○", a case in which it was 1.2 μm or more and less than 1.5 μm was evaluated to be "Δ", and a case in which it was 1.5 μm or more was evaluated to be "X", which are listed in Table 2. This evaluation was performed for Substrate A for Evaluation produced using Resin Sheet with Inorganic Layer A (with a resin composition layer thickness of 10 μm).

<Dimensional Observation of Via Holes and Evaluation of Haloing>

(1) Dimensional Observation of Via Holes

Substrate B for Evaluation was observed with an optical microscope ("KH8700" manufactured by Hirox Co., Ltd.). Specifically, using the optical microscope (CCD), the insulating layer around the via holes was observed from above Substrate B for Evaluation. Dimensional observation of the via holes was performed by focusing the optical microscope on a via top. From an observed image, the top diameter of the via holes was measured. The measurement was performed for five randomly selected via holes, and an average of the measured values of the top diameters of the five via holes was employed as the top diameter Lt (μm) of the via holes of the sample.

(2) Measurement of Haloing Distance

With the dimensional observation of the via holes, a donut-shaped area (a haloing part) in which the insulating layer had been discolored to white was observed around the via holes. The haloing part was present concentrically with the via hole from the edge of the via top of the via hole. Then, from the observed image, the radius r1 of the via top of the via hole (μm: corresponding to the inner circumferential radius of the haloing part) and the outer circumferential radius r2 (μm) of the haloing part were measured, and the difference r2−r1 between the radius r1 and the radius r2 was calculated as a haloing distance from the edge of the via top at the measured point. An average of measurement values of the haloing distance of five via holes was employed as the haloing distance Wt (μm) from the edge of the via top of the sample.

(3) Evaluation of Haloing Ratio

Using the top diameter Lt and the haloing distance Wt of the via hole obtained in (1) and (2), a haloing ratio Ht (%) before the roughening treatment was calculated by the expression below:

$$Ht = Wt/(Lt/2) \times 100$$

A case in which this haloing ratio Ht was 35% or less was evaluated to be "○", whereas a case in which it was larger than 35% was evaluated to be "X", which are listed in Table 2.

<Inorganic Filler>

Inorganic fillers used in Examples and Comparative Examples are as follows.

Inorganic Filler 1: 100 parts of spherical silica ("SC2500SQ" manufactured by Admatechs, with an average particle diameter of 0.63 μm and a specific surface area of 11.2 $m^2/g$) surface-treated with 1 part of N-phenyl-3-aminopropyltrimethoxysilane ("KBM573" manufactured by Shin-Etsu Chemical Co., Ltd.)

Inorganic Filler 2: 100 parts of spherical silica ("UFP-30" manufactured by Denka Co., Ltd., with an average particle diameter of 0.078 μm and a specific surface area of 30.7 $m^2/g$) surface-treated with 2 parts of N-phenyl-3-aminopropyltrimethoxysilane ("KBM573" manufactured by Shin-Etsu Chemical Co., Ltd.).

<Preparation Example 1> Preparation of Resin Composition 1

Six parts of a bixylenol type epoxy resin ("YX4000HK" manufactured by Mitsubishi Chemical Corporation, with an epoxy equivalent weight of about 185), 5 parts of a naphthol type epoxy resin ("ESN475V" manufactured by Nippon Steel & Sumikin Chemical Co., Ltd., with an epoxy equivalent weight of about 332), 15 parts of a bisphenol AF type epoxy resin ("YL7760" manufactured by Mitsubishi Chemical Corporation, with an epoxy equivalent weight of about 238), 2 parts of a cyclohexane type epoxy resin ("ZX1658GS" manufactured by Mitsubishi Chemical Corporation, with an epoxy equivalent weight of about 135), and 2 parts of a phenoxy resin ("YX7553BH30" manufactured by Mitsubishi Chemical Corporation, a 1:1 solution of cyclohexanone:methyl ethyl ketone (MEK) with a solid content of 30% by mass, Mw=35,000) were heated and dissolved in a mixed solvent of 20 parts of solvent naphtha and 10 parts of cyclohexanone. After the mixture was cooled to room temperature, 4 parts of a triazine skeleton-containing cresol novolac-based curing agent ("LA-3018-50P" manufactured by DIC Corporation, with a hydroxy group equivalent weight of about 151, a 2-methoxypropanol solution with a solid content of 50%), 6 parts of an active ester-based curing agent ("EXB-8000L-65™" manufactured by DIC Corporation, with an active group equivalent weight of about 220, a toluene solution with a non-volatile component of 65% by mass), 70 parts of Inorganic Filler 1, and 0.05 part of an amine-based accelerator (4-dimethylaminopyridine (DMAP)) were mixed into the cooled mixture, and the resultant mixture was uniformly dispersed with a high-speed rotation mixer and was filtered with a cartridge filter ("SHP020" manufactured by Roki Techno Co., Ltd.) to prepare Resin Composition 1.

<Preparation Example 2> Preparation of Resin Composition 2

Six parts of a bixylenol type epoxy resin ("YX4000HK" manufactured by Mitsubishi Chemical Corporation, with an epoxy equivalent weight of about 185), 5 parts of a naphthol type epoxy resin ("ESN475V" manufactured by Nippon Steel & Sumikin Chemical Co., Ltd., with an epoxy equivalent weight of about 332), 15 parts of a bisphenol AF type epoxy resin ("YL7760" manufactured by Mitsubishi Chemical Corporation, with an epoxy equivalent weight of about 238), 4 parts by mass of a bisphenol type epoxy resin ("ZX1059" manufactured by Nippon Steel & Sumikin Chemical Co., Ltd., with an epoxy equivalent weight of about 169, a 1:1 mixed product of a bisphenol A type one and a bisphenol F type one), 2 parts of a naphthylene ether type epoxy resin ("HP6000L" manufactured by DIC Corporation, with an epoxy equivalent weight of about 213), and 2 parts of a phenoxy resin ("YL7500BH30" manufactured by Mitsubishi Chemical Corporation, a 1:1 solution of cyclohexanone:methyl ethyl ketone (MEK) with a solid content of 30% by mass, Mw=44,000) were heated and dissolved in a mixed solvent of 20 parts of solvent naphtha and 10 parts of cyclohexanone. After the mixture was cooled to room temperature, 4 parts of a triazine skeleton-containing cresol novolac-based curing agent ("LA-3018-50P" manufactured by DIC Corporation, with a hydroxy group equivalent weight of about 151, a 2-methoxypropanol solution with a solid content of 50%), 6 parts of an active ester-based curing agent ("EXB-8150-65T" manufactured by DIC Corporation, with an active group equivalent weight of about 229, an MEK solution with a non-volatile component of 65% by mass), 120 parts of Inorganic Filler 1, and 0.05 part of an amine-based accelerator (4-dimethylaminopyridine (DMAP)) were mixed into the cooled mixture, and the resultant mixture was uniformly dispersed with a high-speed rotation mixer and was filtered with a cartridge filter ("SHP020" manufactured by Roki Techno Co., Ltd.) to prepare Resin Composition 2.

<Preparation Example 3> Preparation of Resin Composition 3

Resin Composition 3 was prepared in the same manner as in Preparation Example 2 except that (i) 12 parts of an active ester-based curing agent ("EXE-8000L-65™" manufactured by DIC Corporation, with an active group equivalent weight of about 220, an MEK solution with a non-volatile component of 65% by mass) was used in place of 6 parts of the active ester-based curing agent ("EXB-8150-65T" manufactured by DIC Corporation, with an active group equivalent weight of about 229, an MEK solution with a non-volatile component of 65% by mass) and that (ii) 60 parts of Inorganic Filler 2 was used in place of 120 parts of Inorganic Filler 1.

The components and the amounts thereof (the parts by mass of the non-volatile component) used in the preparation of Resin Compositions 1 to 3 are listed in Table 1.

solvent amount in the resin composition layer of 1.2%). After that, a polypropylene film ("Alphan MA-411" manufactured by Oji F-Tex Co., Ltd., with a thickness of 15 μm) as a protective film was laminated on the exposed surface (the surface opposite to the release layer) of the resin composition layer such that its rough surface was in contact with the resin composition layer. Thus, Resin Sheet with Inorganic Layer A having a layer configuration of the inorganic layer/the support/the release layer/the resin composition layer/the protective film was obtained.

Resin Sheet with Inorganic Layer B was obtained in a manner similar to the above except that Resin Composition 1 was uniformly applied with a die coater such that the thickness of the resin composition layer after being dried was 25 μm.

(3) Manufacture of Printed Wiring Board

Using the obtained resin sheet with an inorganic layer, a printed wiring board was manufactured in accordance with the procedure in the above [Preparation of Sample for Measurement and Evaluation].

TABLE 1

|  |  |  | Resin composition | | |
|---|---|---|---|---|---|
|  |  |  | 1 | 2 | 3 |
| Components (parts by mass*) | Epoxy resin | YX4000HK | 6 | 6 | 6 |
|  |  | ESN475V | 5 | 5 | 5 |
|  |  | YL7760 | 15 | 15 | 15 |
|  |  | HP6000L | 0 | 2 | 2 |
|  |  | ZX1059 | 0 | 4 | 4 |
|  |  | ZX1658GS | 2 | 0 | 0 |
|  | Curing agent | LA-3018-50P | 2 | 2 | 2 |
|  |  | EXB-8000L-65TM | 3.9 | 0 | 7.8 |
|  |  | EXB-8150-65T | 0 | 3.9 | 0 |
|  | Inorganic filler | Inorganic filler 1 | 70 | 120 | 0 |
|  |  | Inorganic filler 2 | 0 | 0 | 60 |
|  | Thermoplastic resin | YX7553BH30 | 0.6 | 0 | 0 |
|  |  | YL7500BH30 | 0 | 0.6 | 0.6 |
|  | Accelerator | DMAP | 0.05 | 0.05 | 0.05 |
|  | Total of non-volatile components |  | 104.55 | 158.55 | 102.45 |
|  | Total of resin components |  | 34.55 | 38.55 | 42.45 |
| Content of inorganic filler*[1] (% by mass) |  |  | 67.0 | 75.7 | 58.6 |

*In terms of non-volatile components
*[1]The amount when total amount of non-volatile components is defined as 100% by mass.

Example 1

(1) Production of Support with Inorganic Layer

As a support, a PET film ("Lumirror R80" manufactured by Toray Industries, Inc., with a thickness of 38 μm and a softening point of 130° C.) was prepared. A release layer was formed on one face of the support using an alkyd resin-based release agent ("AL-5" manufactured by Lintec Corporation). Next, on the exposed surface (the face opposite to the release layer) of the PET film, a Cu layer (with a thickness of 0.1 μm) was formed by vapor deposition using a sputtering apparatus ("E-400S" manufactured by Canon Anelva Corporation). In this way, a support with an inorganic layer having a layer configuration of the inorganic layer/the support/the release layer was obtained.

(2) Production of Resin Sheet with Inorganic Layer

Resin Composition 1 was uniformly applied to the release layer of the obtained support with an inorganic layer with a die coater such that the thickness of the resin composition layer after being dried was 10 μm. Then, Resin Composition 1 was dried at 70° C. to 95° C. for 2 minutes to form the resin composition layer on the release layer (with a residual Example 2

A resin sheet with an inorganic layer was produced in the same manner as in Example 1 except that Resin Composition 2 (with a residual solvent amount in the resin composition layer of 1.8%) was used in place of Resin Composition 1. Using the obtained resin sheet with an inorganic layer, a printed wiring board was manufactured in accordance with the procedure in the above [Preparation of Sample for Measurement and Evaluation].

Example 3

A resin sheet with an inorganic layer was produced in the same manner as in Example 1 except that Resin Composition 3 (with a residual solvent amount in the resin composition layer of 2.30) was used in place of Resin Composition 1. Using the obtained resin sheet with an inorganic layer, a printed wiring board was manufactured in accordance with the procedure in the above [Preparation of Sample for Measurement and Evaluation].

Example 4

A resin sheet with an inorganic layer was produced in the same manner as in Example 1 except that a Cu layer (with a thickness of 5 μm) was formed in place of the Cu layer (with a thickness of 0.1 μm). Using the obtained resin sheet with an inorganic layer, a printed wiring board was manufactured in accordance with the procedure in the above [Preparation of Sample for Measurement and Evaluation].

Example 5

A resin sheet with an inorganic layer was produced in the same manner as in Example 1 except that a Ti layer (with a thickness of 0.1 μm) was formed in place of the Cu layer (with a thickness of 0.1 μm). Using the obtained resin sheet with an inorganic layer, a printed wiring board was manufactured in accordance with the procedure in the above [Preparation of Sample for Measurement and Evaluation].

Example 6

A resin sheet with an inorganic layer was produced in the same manner as in Example 1 except that a Ti layer (with a thickness of 5 μm) was formed in place of the Cu layer (with a thickness of 0.1 μm). Using the obtained resin sheet with an inorganic layer, a printed wiring board was manufactured in accordance with the procedure in the above [Preparation of Sample for Measurement and Evaluation].

Example 7

A resin sheet with an inorganic layer was produced in the same manner as in Example 1 except that a Ni layer (with a thickness of 0.1 μm) was formed in place of the Cu layer (with a thickness of 0.1 μm). Using the obtained resin sheet with an inorganic layer, a printed wiring board was manufactured in accordance with the procedure in the above [Preparation of Sample for Measurement and Evaluation].

Example 8

A resin sheet with an inorganic layer was produced in the same manner as in Example 1 except that a Ni layer (with a thickness of 5 μm) was formed in place of the Cu layer (with a thickness of 0.1 μm). Using the obtained resin sheet with an inorganic layer, a printed wiring board was manufactured in accordance with the procedure in the above [Preparation of Sample for Measurement and Evaluation].

Example 9

A resin sheet with an inorganic layer was produced in the same manner as in Example 1 except that an Al layer (with a thickness of 0.1 μm) was formed in place of the Cu layer (with a thickness of 0.1 μm). Using the obtained resin sheet with an inorganic layer, a printed wiring board was manufactured in accordance with the procedure in the above [Preparation of Sample for Measurement and Evaluation].

Example 10

A resin sheet with an inorganic layer was produced in the same manner as in Example 1 except that an Al layer (with a thickness of 5 μm) was formed in place of the Cu layer (with a thickness of 0.1 μm). Using the obtained resin sheet with an inorganic layer, a printed wiring board was manufactured in accordance with the procedure in the above [Preparation of Sample for Measurement and Evaluation].

Example 11

A resin sheet with an inorganic layer was produced in the same manner as in Example 1 except that a silicon oxide layer (with a thickness of 0.1 μm) was formed in place of the Cu layer (with a thickness of 0.1 μm). Using the obtained resin sheet with an inorganic layer, a printed wiring board was manufactured in accordance with the procedure in the above [Preparation of Sample for Measurement and Evaluation].

Example 12

A resin sheet with an inorganic layer was produced in the same manner as in Example 1 except that a silicon oxide layer (with a thickness of 5 μm) was formed in place of the Cu layer (with a thickness of 0.1 μm). Using the obtained resin sheet with an inorganic layer, a printed wiring board was manufactured in accordance with the procedure in the above [Preparation of Sample for Measurement and Evaluation].

Comparative Example 1

A resin sheet was produced in the same manner as in Example 1 except that a PET film with a release layer (the release layer had been formed on one surface of "Lumirror R80" with a thickness of 38 μm and a softening point of 130° C. manufactured by Toray Industries, Inc. as a support using an alkyd resin-based release agent ("AL-5" manufactured by Lintec Corporation)) was used in place of the support with an inorganic layer. Using the obtained resin sheet, a printed wiring board was manufactured in accordance with the procedure in the above [Preparation of Sample for Measurement and Evaluation].

Comparative Example 2

A support with an organic layer and a resin sheet with an organic layer were produced in the same manner as in Example 1 except that a polyvinyl butyral resin ("BX-5" manufactured by Sekisui Chemical Co., Ltd., 1 μm) as an organic layer was used in place of the Cu layer (with a thickness of 0.1 μm) formed by vapor deposition. Using the obtained resin sheet with an organic layer, a printed wiring board was manufactured in accordance with the procedure in the above [Preparation of Sample for Measurement and Evaluation].

The evaluation results of the respective Examples and Comparative Examples are shown in Table 2.

TABLE 2

| | | | Examples | | | | | | | | | | | | Comparative Example | |
|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 1 | 2 |
| Resin sheet with inorganic layer | Resin composition layer*[1] | | 1 | 2 | 3 | 1 | 1 | 1 | 1 | 1 | 1 | 1 | 1 | 1 | 1 | 1 |
| | Inorganic layer | Material | Cu | Cu | Cu | Cu | Ti | Ti | N | N | Al | Al | SiOx | SiOx | — | Organic |
| | | Thickness (μm) | 0.1 | 0.1 | 0.1 | 5 | 0.1 | 5 | 0.1 | 5 | 0.1 | 5 | 0.1 | 5 | — | 1 |
| Flatness*[2] | | | 1 | 0.8 | 1.1 | 0.8 | 1 | 0.8 | 1.1 | 0.9 | 1 | 0.8 | 1.1 | 0.9 | 1.5 | 1.2 |
| | | | ○ | ○ | ○ | ○ | ○ | ○ | ○ | ○ | ○ | ○ | ○ | ○ | x | Δ |
| UV laser | Via top diameter Lt (μm) | | 35 | 31 | 34 | 34 | 31 | 30 | 32 | 31 | 31 | 30 | 35 | 33 | 32 | 35 |
| | Haloing distance Wt (μm) | | 4 | 5 | 4 | 3 | 3 | 2 | 4 | 3 | 2 | 2 | 5 | 4 | 30 | 20 |
| | Haloing ratio Ht (%) | | 23 | 32 | 24 | 18 | 19 | 13 | 25 | 19 | 13 | 13 | 29 | 24 | 188 | 114 |
| | Haloing evaluation | | ○ | ○ | ○ | ○ | ○ | ○ | ○ | ○ | ○ | ○ | ○ | ○ | x | x |
| CO₂ gas laser | Via top diameter Lt (μm) | | 62 | 59 | 62 | 58 | 60 | 58 | 61 | 59 | 60 | 58 | 62 | 60 | 62 | 60 |
| | Haloing distance Wt (μm) | | 4 | 8 | 6 | 3 | 5 | 4 | 4 | 3 | 6 | 4 | 4 | 3 | 30 | 25 |
| | Haloing ratio Ht (%) | | 13 | 27 | 19 | 10 | 17 | 14 | 13 | 10 | 20 | 14 | 13 | 10 | 97 | 83 |
| | Haloing evaluation | | ○ | ○ | ○ | ○ | ○ | ○ | ○ | ○ | ○ | ○ | ○ | ○ | x | x |

*[1]Resin composition number used for forming resin composition layer
*[2]The upper column shows Rt (μm).

What is claimed is:

1. A method for manufacturing a printed wiring board, comprising:
   (A) preparing (A1) a sheet by:
   (1) forming (ii) an inorganic layer on one side of (i) a support by vapor deposition;
   (2) forming (iii) a release layer on the other side of said (i) support; and
   (3) forming (iv) a resin composition layer on said (iii) release layer,
   to obtain a sheet having a structure of said support in contact with said release layer; or
   (A') preparing (A2) a sheet by:
   (1') forming (ii) an inorganic layer on one side of (i) a support by vapor deposition;
   (2') forming (iii) a release layer on the exposed side of said (ii) inorganic layer; and
   (3') forming (iv) a resin composition layer on said (iii) release layer,
   to obtain a sheet having a structure of said inorganic layer in contact with said release layer;
   (B) laminating said sheet (A1) or said sheet (2) onto an internal layer substrate so that said resin composition layer of said sheet (A1) or said sheet (A2) is in contact with said internal layer substrate;
   (C) curing said resin composition layer to form an insulating layer; and
   (D) perforating said insulating layer,
   wherein said resin composition layer comprises an active ester-based curing agent, and
   when a thickness of said resin composition layer is defined as t1 (μm), a thickness t (μm) of said inorganic layer satisfies a relation of t≥0.5/t1, provided that t≥0.05.

2. The method according to claim 1, wherein said release layer is in contact with said inorganic layer.

3. The method according to claim 1, said release layer is in contact with said support.

4. The method according to claim 1, further comprising:
   (E) peeling off said support with said inorganic layer from said insulating layer.

5. The method according to claim 4, wherein said (D) perforating is performed using a CO₂ laser, and
   said (E) peeling is performed after said (D) perforating.

6. The method according to claim 4, wherein said (D), perforating is performed using a UV laser, and
   said (E) peeling is performed before said (D) perforating.

7. The method according to claim 1, wherein said inorganic layer is a layer of one or more inorganic materials selected from the group consisting of a metal, a metal oxide, and mixtures thereof.

8. The method according to claim 7, wherein said metal is one or more metals selected from the group consisting of copper, titanium, nickel, aluminum, gold, platinum, palladium, silver, cobalt, chromium, zinc, tungsten, iron, tin, indium, silicon, germanium, and alloys thereof and said metal oxide is one or more oxides of one or more metals selected from the group consisting of copper, titanium, nickel, aluminum, gold, platinum, palladium, silver, cobalt, chromium, zinc, tungsten, iron, tin, indium, silicon, germanium.

9. The method according to claim 1, wherein said inorganic layer is a single layer structure or a multilayer structure in which two or more layers formed of different metals or metal oxides are laminated on each other.

10. The method according to claim 1, wherein the thickness of the inorganic layer is 50 μm or less.

11. The method according to claim 1, wherein in (3) or (3'), applying a resin varnish in which a resin composition is dissolved in an organic solvent onto said (iii) release layer and drying the resin varnish to form said (iv) resin composition layer with a thickness of 30 μm or less, the resin composition comprising the active ester-based curing agent and an inorganic filler, and the content of the inorganic filler in the resin composition being 50% by mass or more when the amount of non-volatile components in the resin composition is defined as 100% by mass.

12. A sheet comprising:
   (i) a support in contact with (ii) an inorganic layer,
   (iii) a release layer, and
   (iv) a resin composition layer in contact with said release layer,
   wherein said sheet has a structure of said support in contact with said release layer or a structure of said inorganic layer in contact with said release layer,
   said resin composition layer comprises an active ester-based curing agent,
   said inorganic layer is an inorganic layer formed by vapor deposition, and
   when a thickness of said resin composition layer is defined as t1 (μm), a thickness t (μm) of said inorganic layer satisfies a relation of t≥0.5/t1, provided that t≥0.05.

13. The resin sheet with an inorganic layer according to claim 12, said release layer is in contact with said inorganic layer.

14. The resin sheet with an inorganic layer according to claim 12, said release layer is in contact with said support.

15. The resin sheet with an inorganic layer according to claim 12, wherein said inorganic layer is a layer of one or more inorganic materials selected from the group consisting of a metal, a metal oxide, and mixtures thereof.

16. The resin sheet according to claim 15, wherein said metal is one or more metals selected from the group consisting of copper, titanium, nickel, aluminum, gold, platinum, palladium, silver, cobalt, chromium, zinc, tungsten, iron, tin, indium, silicon, germanium, and alloys thereof and said metal oxide is one or more oxides of one or more metals selected from the group consisting of copper, titanium, nickel, aluminum, gold, platinum, palladium, silver, cobalt, chromium, zinc, tungsten, iron, tin, indium, silicon, germanium.

17. The resin sheet according to claim 12, wherein said inorganic layer is a single layer structure or a multilayer structure in which two or more layers formed of different metals or metal oxides are laminated on each other.

18. The resin sheet according to claim 12, wherein the thickness of the inorganic layer is 50 μm or less.

19. The resin sheet according to claim 12, wherein the resin composition layer has a thickness of 30 μm or less and further comprises an inorganic filler, the content of the inorganic filler in the resin composition layer being 50% by mass or more when the amount of non-volatile components in the resin composition layer is defined as 100% by mass.

* * * * *